United States Patent [19]

Tsugaru et al.

[11] Patent Number: 4,713,600
[45] Date of Patent: Dec. 15, 1987

[54] LEVEL CONVERSION CIRCUIT

[75] Inventors: Kazunori Tsugaru; Yasuhiro Sugimoto, both of Yokohama, Japan

[73] Assignee: Kabushiki Kaisha Toshiba, Kanagawa, Japan

[21] Appl. No.: 909,295

[22] Filed: Sep. 19, 1986

[30] Foreign Application Priority Data

Sep. 24, 1985 [JP] Japan ................ 60-208855

[51] Int. Cl.⁴ .............................. G05F 3/20
[52] U.S. Cl. ................ 323/351; 323/271; 323/314; 307/264
[58] Field of Search ........... 323/268, 271, 313–314, 323/317, 351; 307/264, 304, 313

[56] References Cited

U.S. PATENT DOCUMENTS

| 3,636,381 | 1/1972 | Press | 323/351 X |
| 3,801,831 | 4/1974 | Dame | 307/264 |
| 4,216,390 | 8/1980 | Stewart | 307/264 |
| 4,357,571 | 11/1982 | Koessler | 323/314 X |
| 4,506,164 | 3/1985 | Higuchi | 307/264 |
| 4,565,960 | 1/1986 | Takata et al. | 323/351 X |

FOREIGN PATENT DOCUMENTS 54-6179 3/1979 Japan .
58-209 1/1983 Japan .

*Primary Examiner*—Peter S. Wong
*Attorney, Agent, or Firm*—Oblon, Fisher, Spivak, McClelland & Maier

[57] ABSTRACT

This invention provides a level conversion circuit comprising: an input terminal means for applying a voltage signal of predetermined amplitude level; an inverter circuit means applied by a first power supply and a second power supply and connected to the input terminal; a first MOS transistor of a first channel type, the source of which is connected to the second power supply, and the gate of which is connected to the output of the inverter circuit means; a current-voltage conversion means for converting from a source-drain current change of the first MOS transistor to voltage change, a first terminal of which is connected to the drain of the first MOS transistor, and a second terminal of which is connected to a third power supply; a second MOS transistor of the second channel type, the source of which is connected to the third power supply, and the gate of which is connected to the first terminal of the current-voltage conversion means; a third MOS transistor of the first channel type, the gate of which is connected to the input terminal, and source of which is connected to the second power supply, and drain of which is connected to the drain of the second MOS transistor; and an output terminal means for supplying a signal, the amplitude level of which is different from that of the voltage level corresponding to the signal applied to the input terminal, which is connected to the drain of the third MOS transistor.

4 Claims, 4 Drawing Figures

LEVEL CONVERSION CIRCUIT

BACKGROUND OF THE INVENTION

1. Field of the Invention

This invention relates to a level conversion circuit which can convert the amplitude level of one signal voltage to a signal level of greater amplitude voltage.

2. Description of the Prior Art

The conventional level conversion circuit, as shown in FIG. 1, comprises a TTL inverter circuit 2, and a common emitter mode bipolar transistor circuit 3. A logic '1' TTL level signal (amplitude: 0 [V] — Vcc1[V]), applied to input terminal, causes a bipolar transistor Q1 to switch off, which in turn causes a bipolar transistor Q2 to switch on. Current from a first power supply Vcc1 flows through transistor Q2, from collector to emitter, causing a bipolar transistor Q3 to switch on. This action causes a logic level '0' to appear at the output of TTL inverter circuit 2.

The logic level '0', which is now applied to the base of common emitter configured transistor Q4, has the effect of switching Q4 off. The resulting high resistance between collector and emitter of Q4 pulls the signal level at the output terminal of Q4 up to the voltage level of a second power supply Vcc2.

A logic level '0', therefore, applied to the input terminal will have the effect of switching Q1 on, and switching Q2 off, which in turn switches Q3 off. Power supply Vcc1 voltage level appears at the output terminal of TTL inverter circuit 2. This logic level '1', which appears at the base of the common emitter configuration, switches Q4 on, thus pulling the voltage at the output terminal down to logic level '0' as a result of the conducting state existing between collector and emitter of Q4.

The conventional circuit, as described above, facilitates amplitude level conversion from an input signal between 0[V] and Vcc1, to an output signal between 0[V] and Vcc2.

Application of bipolar transistors of the type described above, however, present a drawback; namely, the more frequently the current is switched, the greater the power dissipation of the device, which means a larger surface area is required. The power dissipation of the device is about 20 [mW].

Also, in the case of directly connected circuits with different power supply requirements, stable operation cannot be guaranteed. That is to say, although the first driver stage may operate satisfactorily, the rear driven stage may not, due to possible differences in the threshold voltages of the various circuits employed.

SUMMARY OF THE INVENTION

This invention is proposed as an interface circuit capable of converting the TTL signals level needs of computer CPUs to the higher signal levels required for driving system peripherals (such as printer, etc) at low power consumption levels.

This invention provides a level conversion circuit comprising: an input terminal means for applying a voltage signal of predetermined amplitude level; an inverter circuit means applied by a first power supply and a second power supply and connected to the input terminal; a first MOS transistor of a first channel type, the source of which is connected to the second power supply, and the gate of which is connected to the output of the inverter circuit means; a current-voltage conversion means for converting from a source-drain current change of the first MOS transistor to voltage change, a first terminal of which is connected to the drain of the first MOS transistor, and a second terminal of which is connected to a third power supply; a second MOS transistor of the second channel type, the source of which is connected to the third power supply, and the gate of which is connected to the first terminal of the current-voltage conversion means; a third MOS transistor of the first channel type, the gate of which is connected to the input terminal, and source of which is connected to the second power supply, and drain of which is connected to the drain of the second MOS transistor; and an output terminal means for suppling a signal, the amplitude level of which is different from that of the voltage level corresponding to the signal applied to the input terminal, which is connected to the drain of the third MOS transistor.

DETAILED DESCRIPTION OF THE PREFERRED EMBODIMENT

An embodiment of this invention is described in detail as follows, with reference to FIG. 2.

The input terminal is simultaneously connected to the gates of p-channel MOS transistor Q11 and n-channel MOS transistor Q12, which form the CMOS inverter circuit 1, and to the gate of n-channel MOS transistor Q16. The source of Q12 is connected to ground, with its drain connected to the drain of Q11, the source of Q11 is connected to power supply voltage Vcc1 [V].

The output terminal of the CMOS inverter is connected to the gate of n-channel MOS transistor Q13 which has a threshold level of approximately 1 [V]. The drain of Q13 is connected to the drain and gate of p-channel MOS transistor Q14 and to the gate of p-channel MOS transistor Q15. The sources of p-channel MOS transistors Q14 and Q15 are connected to power supply voltage Vcc2 which is at a higher voltage level than that of the power supply voltage (Vcc1) of the input stage. The sources of n-channel MOS transistors Q13 and Q16 are connected to ground. The drain of n-channel MOS transistor Q16 and the drain of p-channel MOS transistor Q15 are connected to the output terminal.

In the example described, the supply voltage level of the pre-conversion stage is given as Vcc1=5[V], and the voltage level of the post-conversion stage is given as Vcc2=15[V]. A signal amplitude of 5[V] (logic level '1') is applied to the input terminal, so that when the signal changes from 5[V] to 0[V] (logic level '0'), Q11 switches on and Q12 switches off. As a result, the output of CMOS inverter circuit 1 switches to 5[V] and Q13, which has a threshold level of 1 [V], turns on to its conducting state, where the gate potential of Q14 and Q15 drops turning both devices on to their conducting states.

On the one hand, with the input, which has dropped from 5[V] to 0[V], Q16 having a threshold level of 1 [V] becomes high resistance and switches off, causing the supply voltage of 15 [V] to appear at the output.

Similarly, when the input changes from 0 [V] to 5 [V], Q11 switches off, and Q12 switches on. As result, the output of the CMOS inverter circuit drops from 5 [V] to 0 [V]. Then Q13 having a threshold level of 1 [V] becomes high resistance and switches off, and the drain and gate of Q14 and the gate of Q15 rise to supply voltage Vcc2 [V]. Consequently, Q14 and Q15 become high resistance and switch off.

On the other hand, with a level change of from 0[V] to 5[V], Q16 switches on to its conducting state in the region of about 1 [V] and the output drops to 0 [V].

Figure 3:
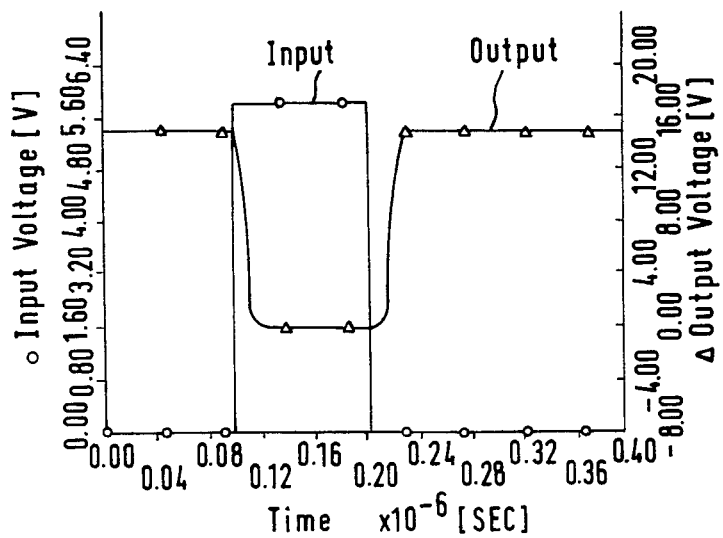
FIG. 3 shows the results of a transient analysis carried out on this invention by SPICE simulation. In the figure, the [O] symbol represent an input value, and the [Δ] symbol represents an output value.

FIG. 3 shows the results of a transient analysis of the circuit configuration implemented by this invention which is obtained by SPICE simulation. FIG. 3 illustrates the signal state during the conversion from a signal level of 0[V]−5[V] to an amplitude level of 0[V]−15[V].

Figure 4:
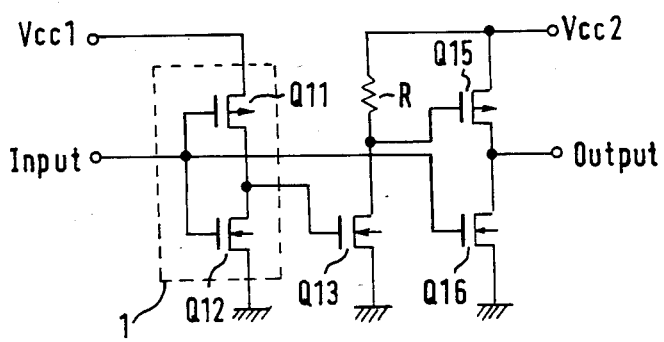
FIG. 4 shows the diagram of the third embodiment for this invention.

Next, the second embodiment of this invention is described according to FIG. 4.

Figure 1:
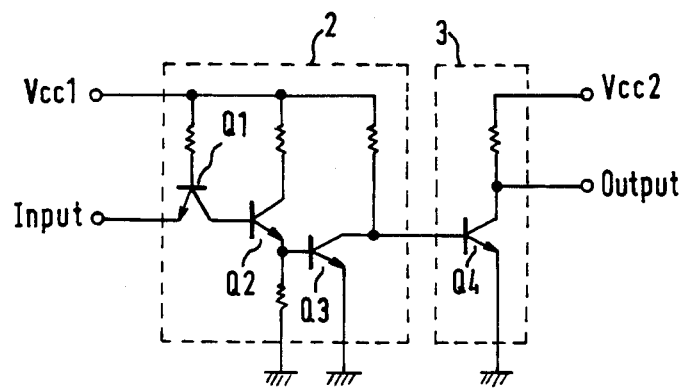
FIG. 1 shows a conventional level conversion circuit.
Figure 2:
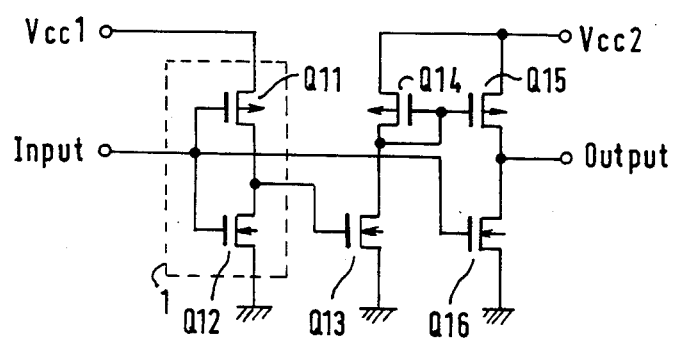
FIG. 2 shows the diagram of the first embodiment for this invention.

As shown in FIG. 4, transistor Q14 in FIG. 2 is replaced by a resistance R. Since other portions are not changed, the explanation of that portions is ommitted.

Transistor Q14 in FIG. 2 converts from the current change flowing through transistor Q13 to a voltage change and introduces to the gate of transistor Q15. The resistance is used for same function.

Consequently, level conversion (0[V]−5[V] to 0[V]−15[V]) from a state in which the circuit is inoperable, as a result of the different 5[V] and 15[V] power supply voltages, which brought about threshold level differences of approximately 2.5[V] and 7.5[V], is made possible by the CMOS configuration which operated at low power dissipation levels through the use of MOS transistors with a threshold value (of approximately 1[V]).

The power dissipation of the prior art device is about 20 [mW]. However, the power dissipation of the invention is about 7.5 [mW]. It is very improved.

It would, of course, be possible to reverse the polarity of the channel types of the transistors utilized in this invention without imposing any limitations on the embodiment, provided CMOS configurations are used.

And, as mentioned above, the CMOS inverter circuit is used in the embodiment of this invention. However, it is not restricted the CMOS inverter. It is not necessary to use the CMOS inverter as far as impurity the signal and the reverse signal to transistor Q13 and transistor Q16, respectively.

As can be seen from the embodiment, utilization of the circuit implemented by this invention enables circuits to be connected without consideration about threshold voltage differences of the circuits.

Also, by taking into account the threshold voltages of the circuit, implementation by similarly formed p-channel and n-channel MOS transistors is possible without the need to manipulate the channel W/L value (channel width-to-length ratio) of the MOS transistor.

The above circuit configuration facilitates voltage level conversion at low power dissipation levels characteristic of CMOS devices. This enables circuits with different power supply voltage requirements to be connected with a greater degree of flexibility.

Furthermore, since the circuit is implemented using CMOS technology, the effective result is that a low power dissipation interface, suitable for small surface area integration is achieved.

Various modifications and variations could be made to the invention without departing from the scorp or spirit of the invention.

What is claimed is:

1. A level conversion circuit comprising:
    an input terminal means for applying a voltage signal of predetermined amplitude level;
    an inverter circuit means applied by a first power supply and a second power supply and connected to said input terminal;
    a first MOS transistor of a first channel type, the source of which is connected to said second power supply, and the gate of which is connected to the output of said inverter circuit means;
    a current-voltage conversion means for converting from a source-drain current change of said first MOS transistor to voltage change, a first terminal of which is connected to the drain of said first MOS transistor, and a second terminal of which is connected to a third power supply;
    a second MOS transistor of a second channel type, the source of which is connected to said third power supply, and the gate of which is connected to the first terminal of said current-voltage conversion means;
    a third MOS transistor of the first channel type, the gate of which is connected to said input terminal, and source of which is connected to said second power supply, and drain of which is connected to the drain of said second MOS transistor; and
    an output terminal means for supplying a signal, the amplitude level of which is different from that of the voltage level corresponding to the signal applied to said input terminal, which is connected to the drain of said third MOS transistor;
    wherein said current-voltage conversion means is a fourth MOS transistor of the second channel type, the source of which is connected to a third power supply, and the drain and gate of which are shorted to form a common connection to the drain of said first MOS transistor.

2. A level conversion circuit according to claim 1 wherein said inverter circuit is a CMOS inverter.

3. A level conversion circuit comprising:
    an input terminal means for applying a voltage signal of predetermined amplitude level;
    an inverter circuit means applied by a first power supply and a second power supply and connected to said input terminal;
    a first MOS transistor of a first channel type, the source of which is connected to said second power supply, and the gate of which is connected to the output of said inverter circuit means;
    a current-voltage conversion means for converting from a source-drain current change of said first MOS transistor to voltage change, a first terminal of which is connected to the drain of said first MOS transistor, and a second terminal of which is connected to a third power supply;
    a second MOS transistor of a second channel type, the source of which is connected to said third power supply, and the gate of which is connected to the first terminal of said current-voltage conversion means;
    a third MOS transistor of the first channel type, the gate of which is connected to said input terminal, and source of which is connected to said second power supply, and drain of which is connected to the drain of said second MOS transistor; and an output terminal means for suppling a signal, the amplitude level of which is different from that of the voltage level corresponding to the signal applied to said input terminal, which is connected to the drain of said third MOS transistor;

wherein said current-voltage conversion means includes a resistance, a first terminal of which is connected the drain of said first MOS transistor, and a second terminal of which is connected to said third power supply.

4. A level conversion circuit according to claim 3, wherein said inverter circuit is a CMOS inverter.

* * * * *